United States Patent
Shin et al.

(10) Patent No.: US 7,312,510 B2
(45) Date of Patent: Dec. 25, 2007

(54) DEVICE USING AMBIPOLAR TRANSPORT IN SB-MOSFET AND METHOD FOR OPERATING THE SAME

(75) Inventors: Jae Heon Shin, Daejeon (KR); Moon Gyu Jang, Daejeon (KR); Yark Yeon Kim, Daejeon (KR); Seong Jae Lee, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 237 days.

(21) Appl. No.: 11/187,654

(22) Filed: Jul. 22, 2005

(65) Prior Publication Data

US 2006/0131621 A1    Jun. 22, 2006

(30) Foreign Application Priority Data

Dec. 21, 2004    (KR)    ............... 10-2004-0109297

(51) Int. Cl.
    *H01L 29/47*    (2006.01)
(52) U.S. Cl. ............... 257/473; 257/471; 257/476; 257/288; 257/E29.148; 327/376; 327/377
(58) Field of Classification Search ............... 257/288, 257/471, 473, 476, E29.148; 327/377, 376
    See application file for complete search history.

(56) References Cited

U.S. PATENT DOCUMENTS 6,303,479 B1    10/2001    Snyder

FOREIGN PATENT DOCUMENTS

KR    10-19980042717    10/1998
KR    2000-0025576    5/2000

OTHER PUBLICATIONS

Ambipolar Schottky barrier silicon on insulator metal oxide semiconductor transistors, Homg-Chih et al., available online Jun. 12, 2002.*

Horng-Chih Lin, Meng-Fan Wang, Chia-Yu Lu, Tiao-Yuan Huang, *Ambipolar Schottky barrier silicon-on-insulator metal-oxide-semiconductor transistors*, National Nano Device Laboratories, Taiwan, Apr. 16, 2002, www.sciencedirect.com.

* cited by examiner

*Primary Examiner*—Thomas Dickey
*Assistant Examiner*—Victor A. Mandala, Jr.
(74) *Attorney, Agent, or Firm*—Blakely, Sokoloff, Taylor & Zafman

(57) ABSTRACT

A device using an ambipolar transport of an SB-MOSFET and a method for operating the same are provided. The SB-MOSFET includes: a silicon channel region; a source and a drain contacted on both sides of the channel region and formed of material including metal layer; and a gate formed on the channel region, with a gate dielectric layer interposed therebetween. Positive (+), 0 or negative (−) gate voltage is selectively applied to the gate, the channel becomes off-state when the gate voltage between a negative threshold voltage and a positive threshold voltage is applied, and the channel becomes a first on-state and a second on-state when the gate voltage is lower than the negative threshold voltage or higher than the positive threshold voltage. Accordingly, it is possible to implement three current states, that is, hole current, electron current, and no current. The SB-MOSFET can be applied to a multi-bit memory and/or multi-bit logic device.

20 Claims, 5 Drawing Sheets

DEVICE USING AMBIPOLAR TRANSPORT IN SB-MOSFET AND METHOD FOR OPERATING THE SAME

CROSS-REFERENCE TO RELATED PATENT APPLICATION

This application claims the benefit of Korean Patent Application No. 10-2004-0109297, filed on Dec. 21, 2004, in the Korean Intellectual Property Office, the disclosure of which is incorporated herein in its entirety by reference.

BACKGROUND OF THE INVENTION

1. Field of the Invention

The present invention relates to a semiconductor device, and more particularly, to a device using an ambipolar transport of an Schottky Barrier Metal-Oxide-Semiconductor Field Effect Transistor (SB-MOSFET) and a method for operating the same.

2. Description of the Related Art

A recent semiconductor fabrication technology makes it possible to fabricate a short-channel transistor of 100 nm or less. As the device is decreasing in size, many unexpected problems are rising. A reduction of gate length inevitably causes short channel effect. In order to fabricate transistor device with very small gate length, methods of suppressing short channel effect have been developed.

As size of devices becomes smaller, the devices following a simple electrical and physical law show complex characteristics caused by several new physical phenomena, which result from the short channel effect. A top-down technique has been used to reduce the existing structure of the device. However, the top-down technique has a limitation in reducing the size of the device. Accordingly, new electronic devices such as CNTs (Carbon Nano Tubes), molecular transistors, single-electron transistors and spintronic devices have been introduced.

The major problem of these new electronic devices is that they are yet in development level and it is difficult to apply the existing advanced silicon (Si) processing technologies to them. Schottky Barrier Tunnel Transistor (SBTT) or Schottky Barrier Metal-Oxide-Semiconductor Field Effect Transistor (SB-MOSFET) are introduced as a semiconductor device that can employ the existing advanced silicon processing technologies in its fabrication and overcome short channel effect of the existing MOSFET.

The SB-MOSFET is a new conceptual device that forms a Schottky barrier between source and channel and between channel and drain by a metal-silicon junction by forming source/drain of metal or metal silicide, instead of n-doped silicon layer or p-doped silicon layer.

A Schottky diode has been studied since the mid-twentieth century. A current level of the MOSFET was exhibited in the late 1990's, and a short channel SB-MOSFET having gate length of 50 nm or less has been fabricated since 2000's. Many quantum theories about operation principle of SB-MOSFET have been also studied.

SUMMARY OF THE INVENTION

The present invention provides an electronic device such as a multi-bit memory and/or a multi-bit logic device using a new characteristic of an SB-MOSFET.

According to an aspect of the present invention, there is provided an SB-MOSFET including: a silicon channel region; a source and a drain contacted on both sides of the channel region and formed of material including metal layer; and a gate formed on the channel region, with a gate dielectric layer interposed therebetween, wherein positive (+), 0 or negative (−) gate voltage is selectively applied to the gate; the channel becomes off-state when the gate voltage between a negative threshold voltage and a positive threshold voltage is applied; and the channel becomes a first on-state and a second on-state when the gate voltage is lower than the negative threshold voltage or higher than the positive threshold voltage.

According to another aspect of the present invention, there is provided an multi-bit memory device including: a silicon channel region; a source and a drain contacted on both sides of the channel region and formed of material including metal layer; a gate formed on the channel region, with a gate dielectric layer interposed therebetween, wherein positive (+), 0 or negative (−) gate voltage is selectively applied to the gate; the channel becomes off-state when the gate voltage between a negative threshold voltage and a positive threshold voltage is applied; and the channel becomes a first on-state and a second on-state when the gate voltage is lower than the negative threshold voltage or higher than the positive threshold voltage; and a capacitor electrically connected to the source and to which different quantity of electric charges are accumulated depending on polarity of the gate voltage.

According to a further another aspect of the present invention, there is provided an logic device including: a silicon channel region; a source contacted at one side of the channel region and formed of material including metal layer; a drain contacted at the other side of the channel region and formed of material including metal layer, the drain and the source facing each other, a bias voltage being applied to the drain; a gate formed on the channel region, with a gate dielectric layer interposed therebetween, wherein positive (+), 0 or negative (−) gate voltage is selectively applied to the gate; the channel becomes off-state when the gate voltage between a negative threshold voltage and a positive threshold voltage is applied; and the channel becomes a first on-state and a second on-state when the gate voltage is lower than the negative threshold voltage or higher than the positive threshold voltage; and a resistor electrically connected to the drain and through which the bias voltage is applied to the drain so that an output voltage electrically connected to the drain and detected is different depending on polarity of the gate voltage.

The metal layer for the source and the drain may include a metal silicide layer.

The channel region may be undoped or P-type doped.

The channel region may be undoped or N-type doped.

One of the negative threshold voltage and the positive threshold voltage may be set depending on height of Schottky barrier with respect to electrons between the source and the channel region, and the other may be set depending on height of Schottky barrier with respect to holes between the drain and the channel region.

Different carriers moves through the channel depending on the first on-state and the second on-state of the channel.

Drain current values flowing from the source to the drain may be different in the first on-state and the second on-state.

One of the drain currents detected in the first on-state and the second on-state of the channel may be formed by flow of holes moving from the drain to the source, and the other is formed by flow of electrons flowing from the source to the drain.

Positive or negative voltage may be applied to the drain in the first on-state and the second on-state of the channel, and the gate voltage may be applied with polarity equal or opposite to the drain voltage, so that the first on-state state and the second on-state are controlled.

According to the present invention, it is possible to provide a multi-bit memory and/or multi-bit logic device using a new characteristic of the SB-MOSFET.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

In the embodiments of the present invention, there is provided an SB-MOSFET that can implement an operation principle of an ambipolar transport property, which is termed by the inventor of this invention. For example, when no voltage is applied to the gate and the drain of the SB-MOSFET, no current flows through the SB-MOSFET. When positive (+) voltages are applied to the gate and the drain, electrons travel from the source to the drain, for example, in an N-type SB-MOSFET. Meanwhile, unlike the typical N-type MOSFET, when negative (−) voltage is applied to the gate and positive (+) voltage is applied to the drain, holes existing in the drain of the N-type SB-MOSFET tunnel through a thin Schottky barrier to the source.

This operation characteristic discovered and developed by the inventor of this invention is an ambipolar transport, a new characteristic that has not been discovered in the existing MOSFET. The reason why this phenomenon is termed "ambipolar transport" is because electrons flow when the positive voltage is applied to the gate and holes flow when the negative voltage is applied to the gate.

The ambipolar transport is considered as a new characteristic that exists only in the SB-MOSFET. The ambipolar transport is expected to provide a function and high integration that has been impossible in the existing MOSFET. For example, in the case of the multi-bit memory, the use of the ambipolar transport is expected to at least double memory capacity in the same degree of integration. Also, it is expected that logic circuits requiring a multi-bit current or multi-bit voltage can be more easily configured using only one or two transistors. Accordingly, this invention will have a pervasive effect on information communication industry.

Figure 1:
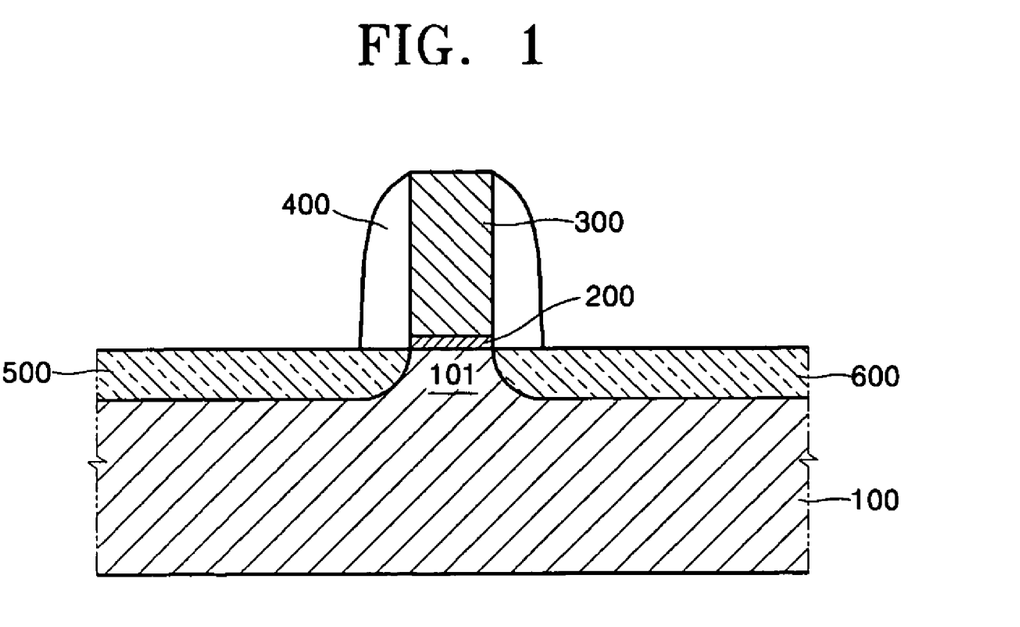
FIG. 1 is a schematic sectional view of an N-type SB-MOSFET according to an embodiment of the present invention.

FIG. 1 is a schematic sectional view of an N-type SB-MOSFET according to an embodiment of the present invention.

Although an N-type SB-MOSFET will be set forth below, it is apparent to those skilled in the art that the present invention can also be equally applied to a P-type SB-MOSFET. Accordingly, the present invention should not be construed as being limited to the N-type SB-MOSFET.

Referring to FIG. 1, the N-type SB-MOSFET may be implemented on a silicon substrate 100. The silicon substrate 100 may be a silicon on insulator (SOI) substrate. The silicon substrate 100 also serves to provide a silicon channel 101. The silicon channel 101 serves as a passage though which a current flows in on-state. In the case of the N-type SB-MOSFET, the silicon channel 101 can be undoped or can be doped with P-type impurities.

A gate dielectric layer 200 is formed on the silicon channel 101. The gate dielectric layer can be, but is not limited to, a silicon oxide layer ($SiO_2$). A gate 300 is formed on the gate dielectric layer 200. The gate 300 can be formed of a polysilicon layer or a metal layer.

Lateral dielectric layers 400 are formed on sides of the gate 300 in a shape of spacer. The lateral dielectric layers 400 can be formed of silicon oxide or other dielectric materials such as silicon nitride layer ($SiN_x$). A source 500 and a drain 600 are formed on both sides of the channel 101, with being adjacent to the gate 300. Unlike the general MOSFET, the source 500 and the drain 600 must be formed of a metal containing material. As a metal containing material, a metal silicide is commonly used for convenience of processing. The metal silicide can be obtained by depositing metal and reacting the metal and silicon through a high temperature annealing. This silicide is widely used because its processing is relatively simple and has a good interfacial characteristic.

The SB-MOSFET constructed as above can exhibit the ambipolar transport property.

Figure 2A:
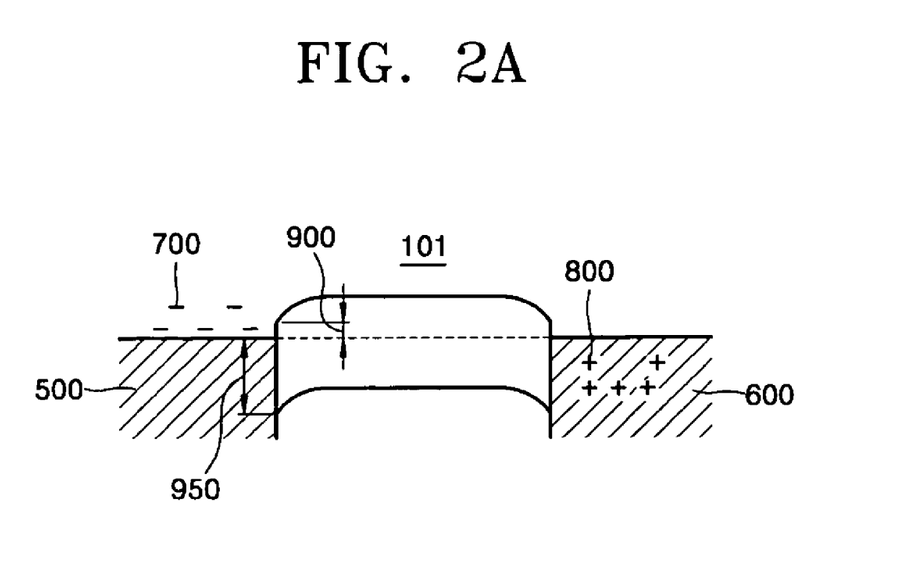
FIGS. 2A through 2C are band diagrams illustrating an operation principle of an ambipolar transport in an N-type SB-MOSFET according to an embodiment of the present invention.
Figure 2B:
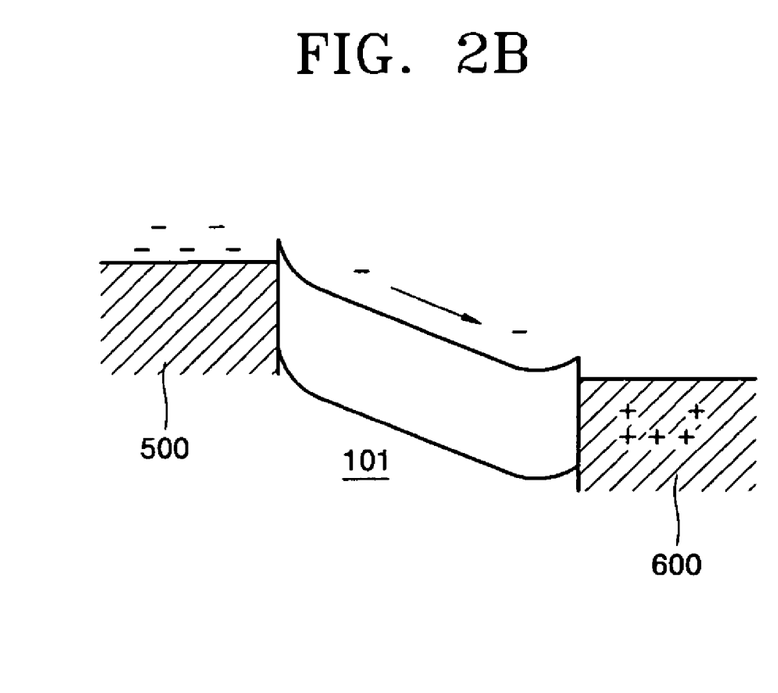
Figure 2C:
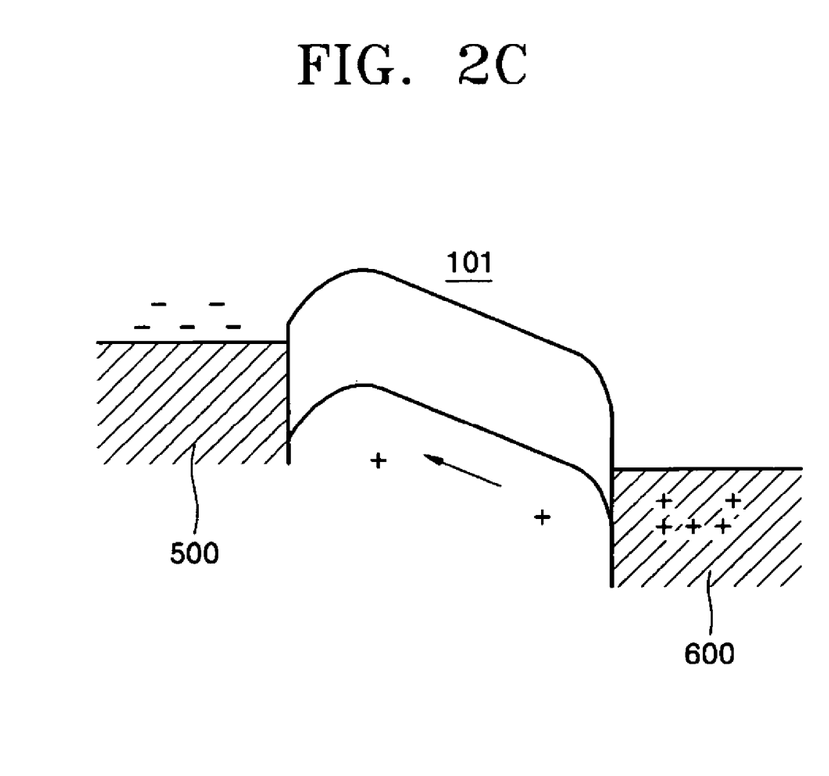

FIGS. 2A through 2C are band diagrams illustrating an operation principle of an ambipolar transport in an N-type SB-MOSFET according to an embodiment of the present invention.

In FIGS. 2A through 2C, a reference numeral 700 represents electrons existing in a conduction band of the source 500, and a reference numeral 800 represents holes existing in a valence band of the drain 600. Also, a reference numeral 900 represents a height ($\phi_{bn}$) of a Schottky barrier formed between a conduction band of the metal silicide and a conduction band of the silicon channel 101, and a reference numeral 950 represents a height ($\phi_{bp}$) of a Schottky barrier formed between a valence band of the metal silicide and a valence band of the silicon channel 101. Here, $\phi_{bn}$ can be considered as the height of the Schottky barrier with respect to the electrons, and $\phi_{bp}$ can be considered as the height of the Schottky barrier with respect to the holes.

Due to a difference of work function, metal and silicon have a different Fermi level. When the metal and the silicon are brought into contact, a barrier is generated between the metal and the silicon because they tend to equalize the Fermi level. This is called Schottky barrier. In the case of the N-type SB-MOSFET, $\phi_{bn}$ must be smaller than $\phi_{bp}$. Accordingly, rare-earth metal silicide such as ErSi$_x$ is appropriate, but the present invention is not limited to that.

A doping type of the silicon channel 101 shown in FIGS. 2A through 2C must be P-type doping or undoping, but a doping concentration does not matter. In the case of an N-type doping, the conduction band of the channel 101 is dropped down to Fermi level. Thus, even when no gate voltage is applied, conduction of electrons occurs. Consequently, the intended operation of the present invention cannot be achieved. For this reason, in the case of the N-type SB-MOSFET, the doping type of the silicon channel 101 must be P-type doping or undoping. Likewise, in the case of the P-type SB-MOSFET, the doping type of the silicon channel must be N-type doping or undoping.

FIG. 2A is a band diagram when no voltage is applied to the gate (300 in FIG. 3) and the drain (600 in FIG. 1). In this case, both electrons and holes cannot pass through the Schottky barrier, so that a current flow in the device is zero.

FIG. 2B is a band diagram when positive (+) voltage is applied to the gate 300 and the drain 600. In this case, like the general N-type MOSFET, electrons 700 flow from the source 500 to the drain 600. The Schottky barrier of the conduction band already becomes so thin that electrons can tunnel in quantum mechanics. Thus, the Schottky barrier cannot serve as a barrier any more.

FIG. 2C is a band diagram when the voltage of the gate 300 changes from positive to negative. In this case, holes 800 existing in the drain 600 tunnel through the Schottky barrier from the thin drain 600 to the source 500. This operation is the ambipolar transport that has not been discovered in the existing MOSFET. The reason why this phenomenon is termed by the ambipolar transport is because the electrons 700 flow when the positive voltage is applied to the gate 300 and the holes 800 flow when the negative voltage is applied to the gate 300. Since this phenomenon has not been yet known, it is arbitrarily termed by the inventor of this invention.

Figure 3A:
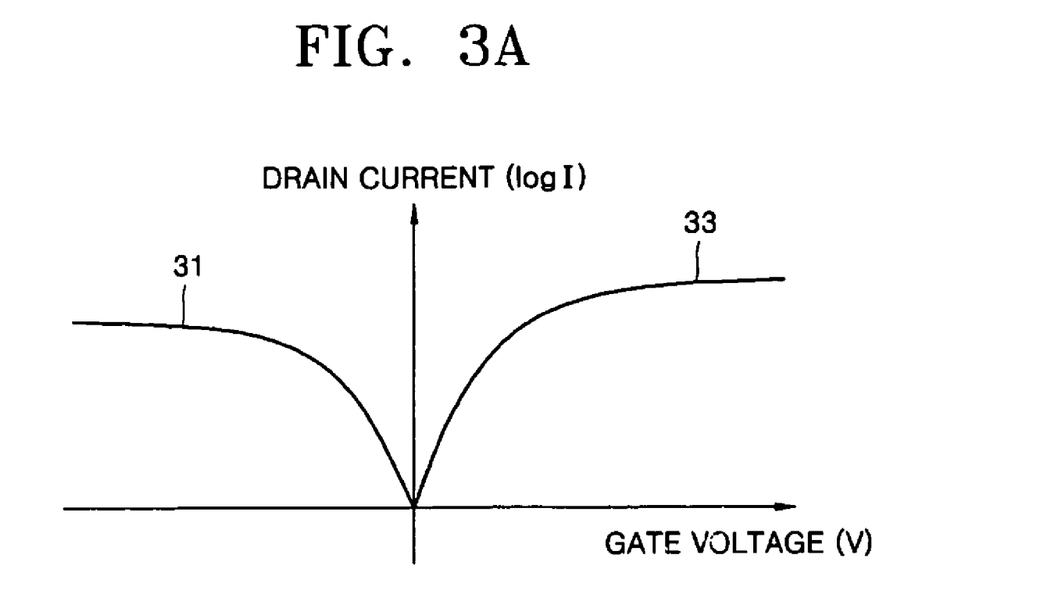
FIGS. 3A and 3B are graphs illustrating relationships between a drain current and a gate voltage in an N-type SB-MOSFET according to an embodiment of the present invention.
Figure 3B:
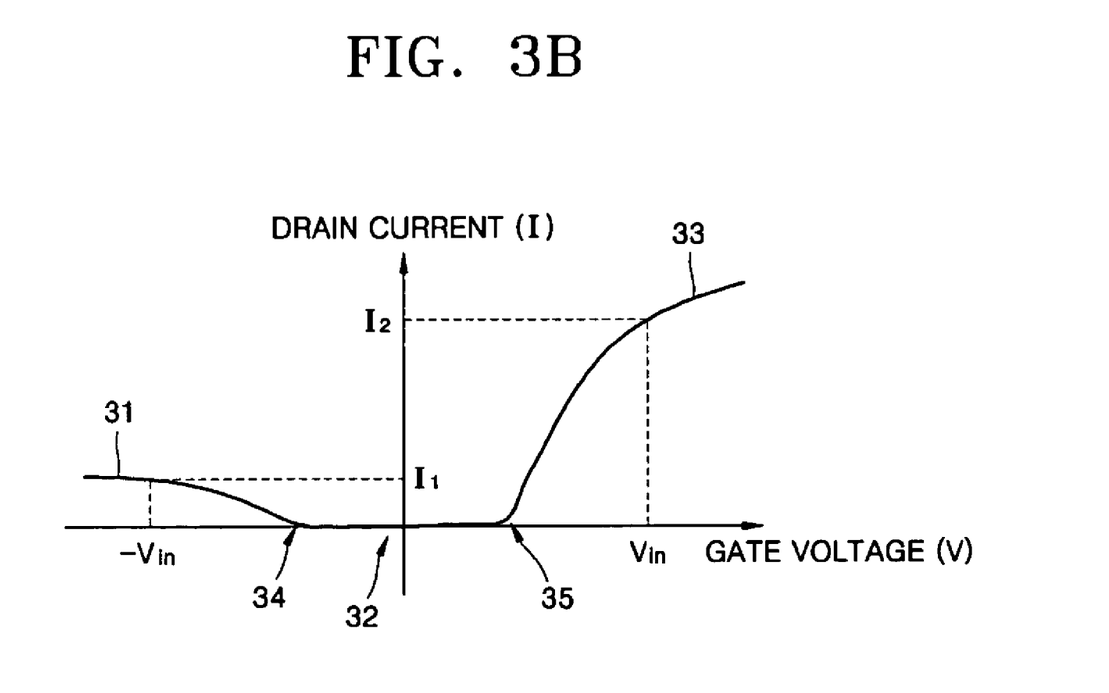

FIGS. 3A and 3B are graphs illustrating relationships between a drain current and a gate voltage in an N-type SB-MOSFET according to an embodiment of the present invention.

FIG. 3A is a log scale and FIG. 3B is a linear scale. It can be seen from FIGS. 3A and 3B that the drain currents 31 and 33 have the same direction but different magnitude depending on the positive and negative gate voltages ($V_{in}$, $-V_{in}$). The reason is because the height of the Schottky barrier is different in the source side ($\phi_{bn}$) and the drain side ($\phi_{bp}$). That is, since the height ($\phi_{bp}$) of the drain side is higher than the height ($\phi_{bn}$) of the source side, the drain current 31 due to the flow of the holes becomes smaller than the drain current 33 due to the flow of the electrons.

A ratio of the drain current 31 to the drain current 33 can be properly controlled by selecting a proper metal or metal silicide. As shown in FIG. 3B, the drain current 31 due to the flow of the holes becomes about 20% of the drain current 33 due to the flow of the electrons. Nonetheless, the ratio can be changed by selecting other metal or metal silicide.

This multi-stage characteristic makes it possible to provide multi-bit (0, 1, 2) logic device or memory. In FIG. 3B, a voltage when the current begins to flow can be considered as a threshold voltage. There are a threshold voltage 34 in the negative voltage side and a threshold voltage 35 in the positive voltage side. No current flows in the voltage section 32 between the threshold voltages 34 and 35.

Figure 4A:
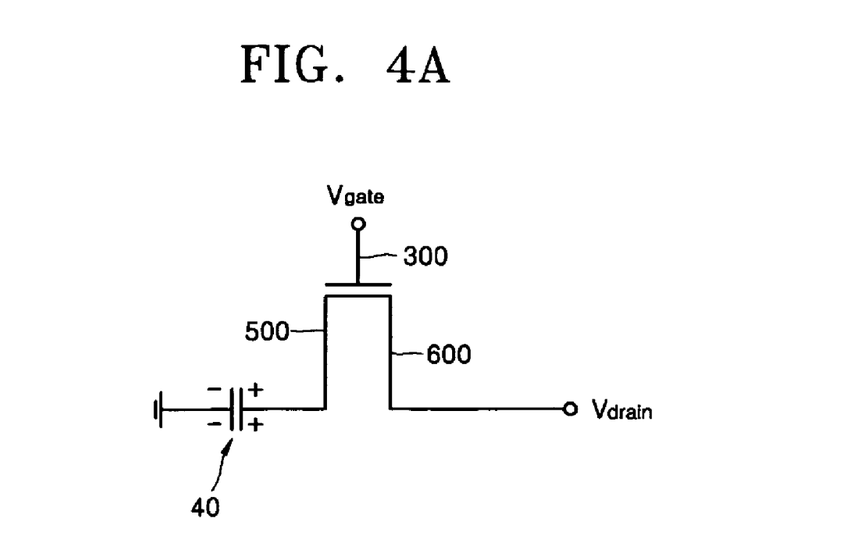
FIGS. 4A and 4B are schematic views for explaining a multi-bit memory using an ambipolar transport of an N-type SB-MOSFET according to an embodiment of the present invention.
Figure 4B:
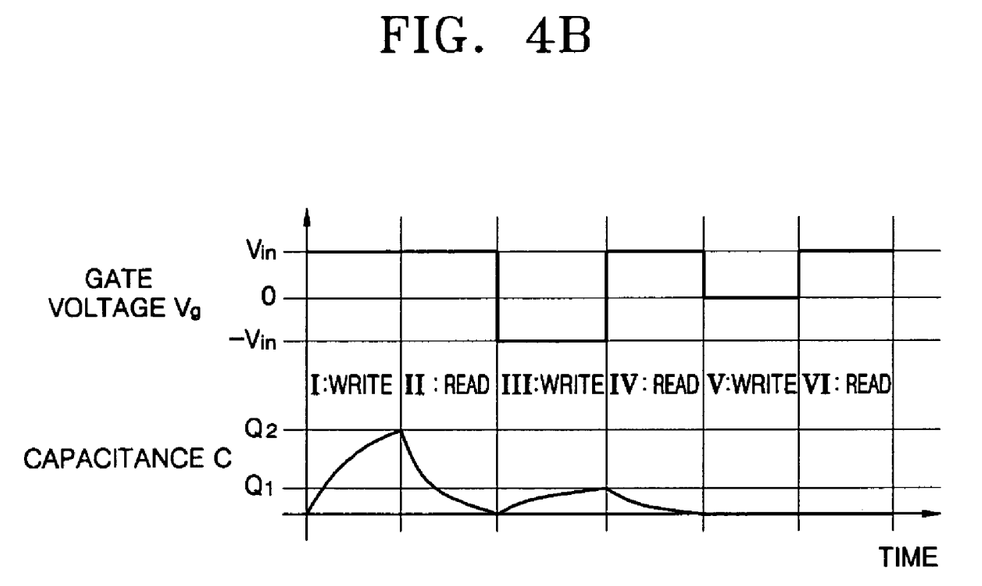

FIG. 4A is a circuit diagram for explaining the multi-bit memory using the ambipolar transport property of the SB-MOSFET, and FIG. 4B is a graph illustrating the operation of the multi-bit memory shown in FIG. 4A.

Referring to FIG. 4A, a simple memory can be configured by serially connecting N-type SB-MOSFETs 300, 500 and 600 and a capacitor 40. A quantity of electric charge accumulated in the capacitor 40 changes depending on the positive or negative gate voltage ($V_{gate}$). Accordingly, in a read operation of the memory, the different voltage levels of 0, 1 and 2 can be read.

A change in a quantity (Q) of electric charge is shown in FIG. 4B when the gate voltage is applied in the range from $-V_{in}$ to $V_{in}$. The write corresponds to the quantity (Q) of electric charge accumulated in the capacitor 40 when the drain voltage ($V_{drain}$) is applied to the drain 600. When the drain voltage ($V_{drain}$) is 0 V, the quantity (Q) of electric charge accumulated in the capacitor 40 is discharged toward the drain 600, and the current flowing toward the drain 600 is read.

In "I" region of FIG. 4B, $Q_2$ is charged to the capacitor 40 because the gate voltage is positive. In "III" region, $Q_1$ is charged to the capacitor 40 because the gate voltage is negative. In "V" region, 0 coulomb is charged to the capacitor 40 because the gate voltage is 0 V. Therefore, when the read operation is performed in "II", "IV" and "VI" regions, different currents of $I_2$, $I_1$ and 0 are detected. In this manner, the device operates as the multi-bit memory.

Figure 5A:
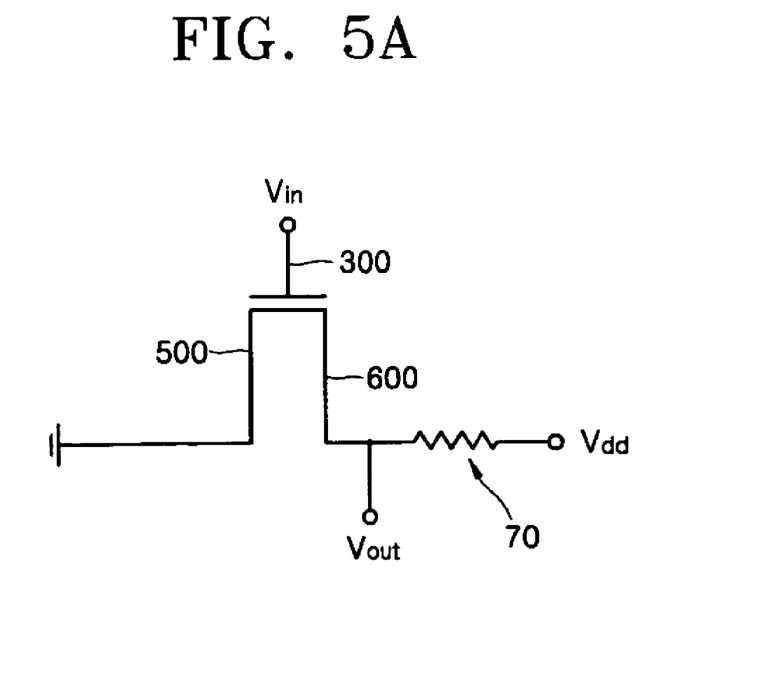
FIGS. 5A and 5B are schematic views for explaining a multi-bit logic device using an ambipolar transport of an N-type SB-MOSFET according to an embodiment of the present invention.
Figure 5B:
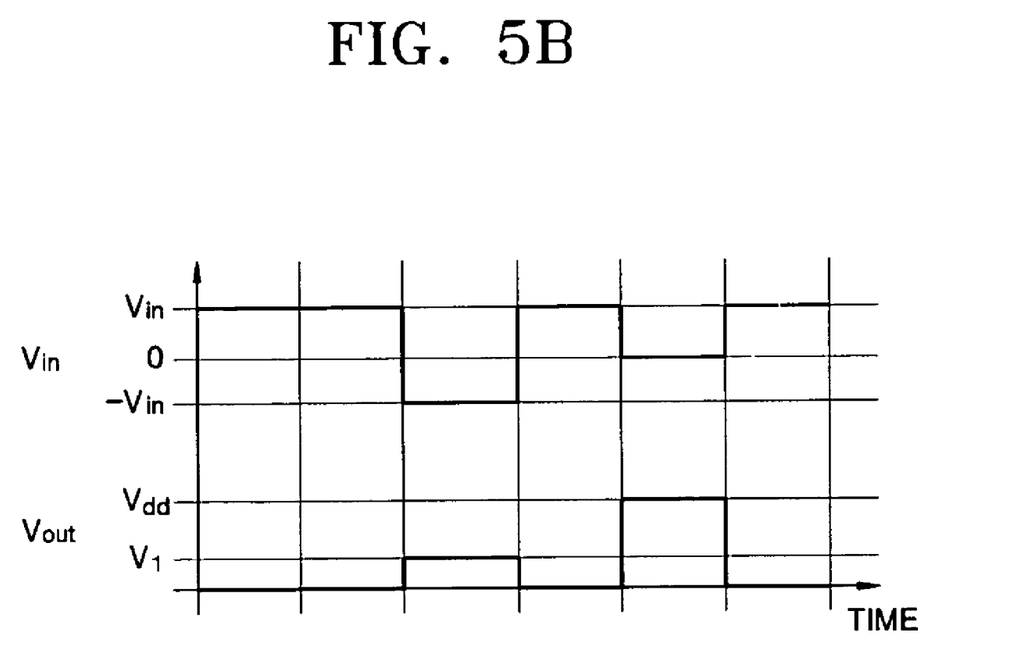

FIG. 5A is a circuit diagram for explaining the multi-bit logic device using the ambipolar transport property of the SB-MOSFET, and FIG. 5B is a graph illustrating the operation of the multi-bit logic device shown in FIG. 5A.

Referring to FIGS. 5A and 5B, device serving as a multi-bit logic element or voltage polarity sensor can be configured by connecting N-type SB-MOSFETs 300, 500 and 600 to a resistor 70. A gate voltage is an input voltage $V_{in}$ and a bias voltage $V_{dd}$ is applied to a drain 600 through the resistor 70.

For example, when the gate voltage is 0 V, the drain current does not flow, so that voltage drop through the resistor 70 is 0 V. Thus, the bias voltage $V_{dd}$ is applied to the drain 600, so that an output voltage $V_{out}$ becomes $V_{dd}$.

When the positive gate voltage is applied, a large amount of electron current flows so that the voltage drop through the resistor 70 is great. Consequently, a minimum voltage is applied on the drain 600. That is, the output voltage $V_{out}$ is almost 0 V.

When the negative gate voltage is applied, a relatively small amount of hole current flows so that the voltage drop through the resistor 70 is less. Thus, the drain 600 maintains a voltage of about $V_1$.

In this manner, the state of the gate voltage (that is, negative state, positive state and 0 state) can be known only by measuring the voltage $V_{out}$. Accordingly, the device can operate as a voltage polarity sensor. Also, the device can operate as a multi-bit logic device in an analog-digital circuit.

Although two applications have been described above, the present invention can also configure a lot of devices and circuits using the ambipolar transport of the SB-MOSFET.

The present invention can provide a multi-bit memory and/or multi-bit logic device using the new characteristic of the SB-MOSFET and a method for operating the same. Since the present invention can at least double the memory capacity and the degree of integration, it can be greatly applied to the development of system on chip (SOC) devices.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An Schottky Barrier Metal-Oxide-Semiconductor Field Effect Transistor (SB-MOSFET) comprising: a channel of silicon region; a source and a drain contacted on both sides of the channel region and formed of material including metal layer; and a single gate formed on the channel region, with a gate dielectric layer interposed there between, wherein positive (+), 0 or negative (−) gate voltage is selectively applied to the single gate; the channel becomes off-state when the single gate voltage between a negative threshold voltage and a positive threshold voltage is applied; and the channel becomes a first on-state and a second on-state when the single gate voltage is lower than the negative threshold voltage or higher than the positive threshold voltage.

2. The SB-MOSFET of claim 1, wherein the metal layer for the source and the drain includes a metal silicide layer.

3. The SB-MOSFET of claim 1, wherein the channel region is undoped or P-type doped.

4. The SB-MOSFET of claim 1, wherein the channel region is undoped or N-type doped.

5. The SB-MOSFET of claim 1, wherein one of the negative threshold voltage and the positive threshold voltage is set depending on height of Schottky barrier with respect to electrons between the source and the channel region, and the other is set depending on height of Schottky barrier with respect to holes between the drain and the channel region.

6. The SB-MOSFET of claim 1, wherein different carriers moves through the channel depending on the first on-state and the second on-state of the channel.

7. The SB-MOSFET of claim 1, wherein drain current values flowing from the source to the drain are different in the first on-state and the second on-state.

8. The SB-MOSFET of claim 7, wherein one of the drain currents detected in the first on-state and the second on-state of the channel is formed by flow of holes moving from the drain to the source, and the other is formed by flow of electrons flowing from the source to the drain.

9. The SB-MOSFET of claim 1, wherein positive or negative voltage is applied to the drain in the first on-state and the second on-state of the channel, and the gate voltage is applied with polarity equal or opposite to the drain voltage, so that the first on-state state and the second on-state are controlled.

10. A multi-bit memory device comprising:
a channel of silicon region;
a source and a drain contacted on both sides of the channel region and formed of material including metal layer;
a gate formed on the channel region, with a gate dielectric layer interposed therebetween, wherein positive (+), 0 or negative (−) gate voltage is selectively applied to the gate; the channel becomes off-state when the gate voltage between a negative threshold voltage and a positive threshold voltage is applied; and the channel becomes a first on-state and a second on-state when the gate voltage is lower than the negative threshold voltage or higher than the positive threshold voltage; and
a capacitor electrically connected to the source and to which different quantity of electric charges are accumulated depending on polarity of the gate voltage.

11. The multi-bit memory device of claim 10, wherein one of the negative threshold voltage and the positive threshold voltage is set depending on height of Schottky barrier with respect to electrons between the source and the channel region, and the other is set depending on height of Schottky barrier with respect to holes between the drain and the channel region.

12. A logic device comprising:
a channel of silicon region;
a source contacted at one side of the channel region and formed of material including metal layer;
a drain contacted at the other side of the channel region and formed of material including metal layer, the drain and the source facing each other, a bias voltage being applied to the drain;
a gate formed on the channel region, with a gate dielectric layer interposed therebetween, wherein positive (+), 0 or negative (−) gate voltage is selectively applied to the gate; the channel becomes off-state when the gate voltage between a negative threshold voltage and a positive threshold voltage is applied; and the channel becomes a first on-state and a second on-state when the gate voltage is lower than the negative threshold voltage or higher than the positive threshold voltage; and
a resistor electrically connected to the drain and through which the bias voltage is applied to the drain so that an output voltage electrically connected to the drain and detected is different depending on polarity of the gate voltage.

13. A logic device claim 12, wherein one of the negative threshold voltage and the positive threshold voltage is set depending on height of Schottky barrier with respect to electrons between the source and the channel region, and the other is set depending on height of Schottky barrier with respect to holes between the drain and the channel region.

14. A Method for operating Schottky Barrier Metal-Oxide-Semiconductor Field Effect Transistor comprising: a silicon channel region; a source and a drain contacted on both sides of the channel region and formed of material including metal layer; and a single gate formed on the channel region, with a single gate dielectric layer interposed there between; comprising: selectively applying positive (+), 0 or negative (−) gate voltage to the single gate, wherein the channel becomes off-state when the single gate voltage between a negative threshold voltage and a positive threshold voltage is applied; and the channel becomes a first on-state and a second on-state when the single gate voltage is lower than the negative threshold voltage or higher than the positive threshold voltage.

15. A Method of claim 14, wherein the metal layer for the source and the drain includes a metal suicide layer.

16. A Method of claim 14, wherein one of the negative threshold voltage and the positive threshold voltage is set depending on height of Schottky barrier with respect to electrons between the source and the channel region, and the other is set depending on height of Schottky barrier with respect to holes between the drain and the channel region.

17. A Method of claim 14, wherein different carriers moves through the channel depending on the first on-state and the second on-state of the channel.

18. A Method of claim 14, wherein drain current values flowing from the source to the drain are different in the first on-state and the second on-state.

19. A Method of claim 18, wherein one of the drain currents detected in the first on-state and the second on-state of the channel is formed by flow of holes moving from the drain to the source, and the other is formed by flow of electrons flowing from the source to the drain.

20. A Method of claim 18, wherein positive or negative voltage is applied to the drain in the first on-state and the second on-state of the channel, and the gate voltage is applied with polarity equal or opposite to the drain voltage, so that the first on-state state and the second on-state are controlled.

* * * * *